(12) United States Patent
Lee et al.

(10) Patent No.: US 10,389,334 B2
(45) Date of Patent: Aug. 20, 2019

(54) SAW RESONATOR HAVING NEGATIVE PROFILE METAL STRUCTURE AND MANUFACTURING METHOD THEREOF

(71) Applicant: WISOL CO., LTD., Osan-si, Gyeonggi-do (KR)

(72) Inventors: Chul Hwa Lee, Yongin-si (KR); Takahiro Sato, Kawasaki (JP)

(73) Assignee: WISOL CO., LTD., Osan-si, Gyeonggi-Do (KR)

( * ) Notice: Subject to any disclaimer, the term of this patent is extended or adjusted under 35 U.S.C. 154(b) by 24 days.

(21) Appl. No.: 15/426,309

(22) Filed: Feb. 7, 2017

(65) Prior Publication Data
US 2017/0264269 A1  Sep. 14, 2017

(30) Foreign Application Priority Data
Mar. 9, 2016 (KR) .................. 10-2016-0028535

(51) Int. Cl.
| | |
|---|---|
| *H03H 9/64* | (2006.01) |
| *H01L 23/34* | (2006.01) |
| *H01L 23/522* | (2006.01) |
| *H01L 23/528* | (2006.01) |
| *H01L 23/532* | (2006.01) |
| *H03H 3/08* | (2006.01) |
| *H03H 9/02* | (2006.01) |
| *H03H 9/145* | (2006.01) |

(52) U.S. Cl.
CPC ........... *H03H 9/6406* (2013.01); *H01L 23/34* (2013.01); *H01L 23/528* (2013.01); *H01L 23/5226* (2013.01); *H01L 23/53228* (2013.01); *H03H 3/08* (2013.01); *H03H 9/02834* (2013.01); *H03H 9/14538* (2013.01); *H01L 23/5283* (2013.01)

(58) Field of Classification Search
CPC ............... H03H 9/6489; H03H 9/6423; H03H 9/02574; H03H 9/02881; H03H 9/14544
USPC .................................................. 333/193–196
See application file for complete search history.

(56) References Cited

U.S. PATENT DOCUMENTS

| | | | | |
|---|---|---|---|---|
| 2013/0335170 A1* | 12/2013 | Ikuta | .................... | H03H 9/0296 333/193 |
| 2016/0020747 A1* | 1/2016 | Steiner | ............... | H03H 9/02834 455/90.2 |

FOREIGN PATENT DOCUMENTS

| | | |
|---|---|---|
| KR | 10-0682432 B1 | 2/2007 |
| KR | 10-2011-0089267 A | 8/2011 |
| KR | 10-2015-0021308 A | 3/2015 |
| KR | 10-2015-0112158 A | 10/2015 |

\* cited by examiner

*Primary Examiner* — Benny T Lee
*Assistant Examiner* — Hafizur Rahman
(74) *Attorney, Agent, or Firm* — LRK Patent Law Firm

(57) ABSTRACT

A surface acoustic wave resonator includes: a piezoelectric substrate; a plurality of metal structures formed on a top surface of the piezoelectric substrate to have a negative profile; and a temperature compensation layer covering the top surface of the piezoelectric substrate and the plurality of metal structures. The surface acoustic wave resonator according to an embodiment of the present invention has a frequency characteristic insensitive to change of profile and has an effect of having a high semi-resonance Q value characteristic.

16 Claims, 6 Drawing Sheets

SAW RESONATOR HAVING NEGATIVE PROFILE METAL STRUCTURE AND MANUFACTURING METHOD THEREOF

CROSS REFERENCE TO RELATED APPLICATION

The present application claims the benefits of Korean Patent Application No. 10-2016-0028535, filed in the Korean Intellectual Property Office on Mar. 9, 2016 the entire content of which is incorporated herein by reference.

BACKGROUND OF THE INVENTION

1. Field of the Invention

The present invention relates to a surface acoustic wave resonator and a manufacturing method thereof, and more specifically, to a surface acoustic wave resonator and a manufacturing method thereof, which will be used for signal filtering or the like needed for signal processing of a wireless communication device.

2. Description of Related Art

As a device using surface acoustic waves, a surface acoustic wave (SAW) device, which has a comb-shaped electrode and a reflection electrode configured of an Inter-Digital Transducer (IDT) formed on the surface of a piezoelectric substrate and uses surface acoustic waves generated by applying power to the comb-shaped electrode, is well known to people. Since the SAW device is miniaturized and light-weighted and may obtain high attenuation, it is widely used in a Tx/Rx filter, an antenna duplexer or the like of a cellular phone terminal.

In the SAW device, a comb-shaped electrode and a reflection electrode made of, for example, aluminum are formed on a piezoelectric substrate made of Lithium Tantalate ($LiTaO_3$), and a protection layer configured of a silicon oxide ($SiO_2$) layer or the like is formed to cover the comb-shaped electrode and the reflection electrode. The silicon oxide ($SiO_2$) protection layer is also a layer for temperature compensation.

If a SAW device is used, advantages described below can be obtained. A SAW resonator is advantageous in that its resonance frequency is ten times or more (direct oscillation of 100 MHz to 2 GHz is possible) higher than that of an existing bulk acoustic wave resonator although the quality factor Q is a little bit inferior. A frequency of a signal needs to be increased to process the information quantity of mobile communication steadily increasing in the present, and a further precise reference frequency is needed accordingly. Since the SAW resonator may obtain a reference frequency a few times higher, it is relatively advantageous in lowering power consumption and reducing the size.

In addition, since a resonance frequency of a SAW resonator is determined by a metal pattern of a crystal surface, it is advantageous in that elements of a uniform characteristic can be mass-produced using a thin-film process of the present IC process. The SAW resonator has an advantage of being integrated with a digital temperature compensation circuit for controlling the frequency on the background of compatibility with the IC process, and the possibility of reducing power consumption increases compared with an existing analog control method.

FIG. 1 is a view showing a temperature compensated SAW (TC-SAW) resonator of the prior art.

Referring to FIG. 1, a temperature compensated SAW (TC-SAW) resonator 10 includes a plurality of metal structures 12 on a piezoelectric substrate ($LiNbO_3$) 11 and has a form of covering the piezoelectric substrate and the metal structures with a temperature compensation layer 13. At this point, the metal structure has a positive profile of 70 to 89 degrees.

However, it is required to develop a temperature compensated SAW resonator having a characteristic of a semi-resonance Q value (a Quality factor) higher than that of a conventional metal structure having such a profile and having a frequency characteristic insensitive to change of profile.

SUMMARY OF THE INVENTION

An object of the present invention is to provide a temperature compensated surface acoustic wave resonator having a semi-resonance Q value characteristic higher than that of a conventional metal structure.

In addition, another object of the present invention is to provide a temperature compensated surface acoustic wave resonator having a frequency characteristic insensitive to change of metal profile.

A surface acoustic wave resonator of the present invention for accomplishing; the above objects includes: a piezoelectric substrate; a plurality of metal structures formed on a top surface of the piezoelectric substrate to have a negative profile; and a temperature compensation layer covering the top surface of the piezoelectric substrate and the plurality of metal structures.

In addition, in the metal structure, preferably, a width of a bottom surface of the metal structure contacting with a top surface of the piezoelectric substrate is smaller than a width of a top surface, which is opposite to the bottom surface, of the metal structure, and a side surface of the metal structure has a negative profile of more than 90 degrees or is formed between 90 and 110 degrees with respect to a surface where the top surface of the piezoelectric substrate contacts with the bottom surface of the metal structure.

In addition, the metal structure includes Cu and is preferably manufactured to surround the bottom surface and the side surface of the Cu with a metal containing any one or more of Cr, Ag, Ti, Al and Ni.

In addition, in the metal structure, a ratio of the metal line width to the pitch is 0.3 to 0.7, and in the surface acoustic wave resonator, a ratio of the layer thickness of the metal structure to the wavelength λ of surface acoustic waves generated by the surface acoustic wave resonator is 4 to 10%, and in the surface acoustic wave resonator, a ratio of the thickness of the temperature compensation layer to the wavelength A is 20 to 40%.

In addition, the temperature compensation layer contains any one of materials of $SiO_2$, AlN and $TeO_2$, and the piezoelectric substrate is a LN (LiNbO3) 128 degree substrate.

A method of manufacturing a surface acoustic wave resonator of the present invention for accomplishing the above objects includes the steps of: depositing a temperature compensation layer on a piezoelectric substrate; patterning a photo resistor on the temperature compensation layer; removing the temperature compensation layer formed in an open portion of the patterned photo resistor by etching; removing the photo resistor; forming a metal structure layer having a negative profile; removing the metal structure layer until the temperature compensation layer is exposed; and deposing an additional temperature compensation layer.

In addition, the step of removing the temperature compensation layer by etching includes the step of removing the temperature compensation layer to have a width decreasing toward the piezoelectric substrate, so that when the step of forming a metal structure layer is performed, the side surface of the metal structure is formed to have a negative profile of more than 90 degrees, preferably between 90 and 110 degrees, with respect to a surface where the top surface of the piezoelectric substrate contacts with the bottom surface of the metal structure.

In addition, the step of forming a metal structure layer includes the step of forming the layer using a material including Cu, and the step of forming a metal structure layer includes the step of forming the layer using a material including Cu after forming a metal layer containing any one or more of Cr, Ag, Ti, Al and Ni.

In addition, in the metal structure, a ratio of the metal line width to the pitch is 0.3 to 0.7, and in the surface acoustic wave resonator, a ratio of the layer thickness of the metal structure to the wavelength $\lambda$ is 4 to 10%, and in the surface acoustic wave resonator, a ratio of the thickness of the temperature compensation layer to the wavelength $\lambda$ is 20 to 40%.

In addition, the temperature compensation layer is deposited through a chemical vapor deposition (CVD) or sputtering process.

In addition, the step of depositing a temperature compensation layer on the piezoelectric substrate includes the step of depositing a mixture of SiNx and SiOx or depositing a SiOx layer after depositing a SiNx layer.

DETAILED DESCRIPTION OF THE PREFERRED EMBODIMENT

Details of the objects and technical configurations of the present invention described above and operational effects according thereto will be further clearly understood by the detailed description hereinafter based on the drawings attached in the specification of the present invention. Embodiments according to an embodiment of the present invention will be described with reference to the accompanying drawings.

The embodiments disclosed in this specification should not be interpreted or used to limit the scope of the present invention. It is natural to those skilled in the art that the description including the embodiments of the specification has various applications. Accordingly, certain embodiments stated in the detailed description of the present invention are merely illustrative to further clearly describe the present invention and is not intended to limit the scope of the present invention to the embodiments.

In addition, an expression of 'including' a component is an expression of an 'open type' which merely refers to existence of corresponding components, and it should not be construed as precluding additional components.

Further, when a component is referred to as being 'connected' or 'coupled' to another component, although it may be directly connected or coupled to the another component, it should be understood that other components may be exist therebetween.

In addition, expressions such as 'first, second' and the like are expressions used only for the purpose of distinguishing a plurality of components and do not limit the sequence or other features among the components.

Figure 1:
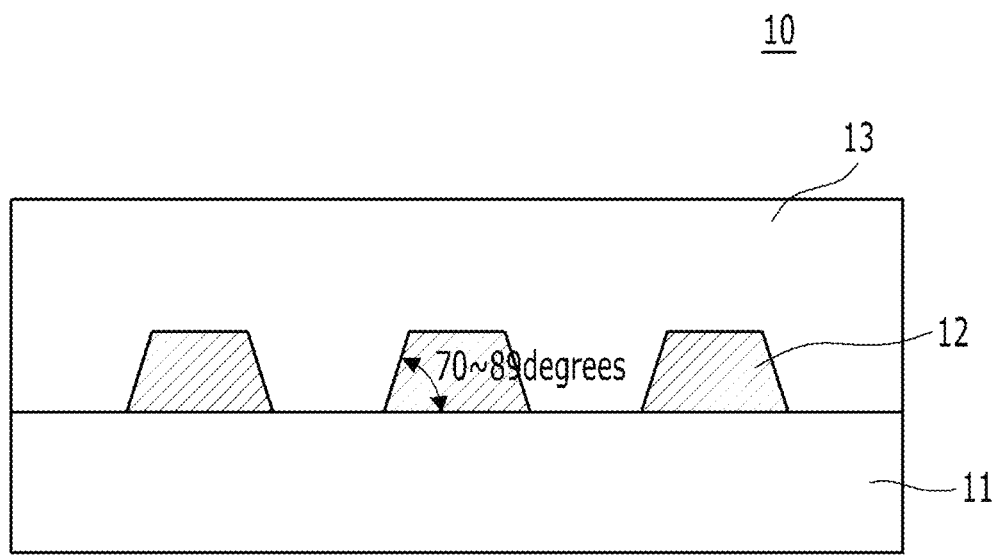
FIG. 1 is a view showing a temperature compensated surface acoustic wave resonator of the prior art.
Figure 2:
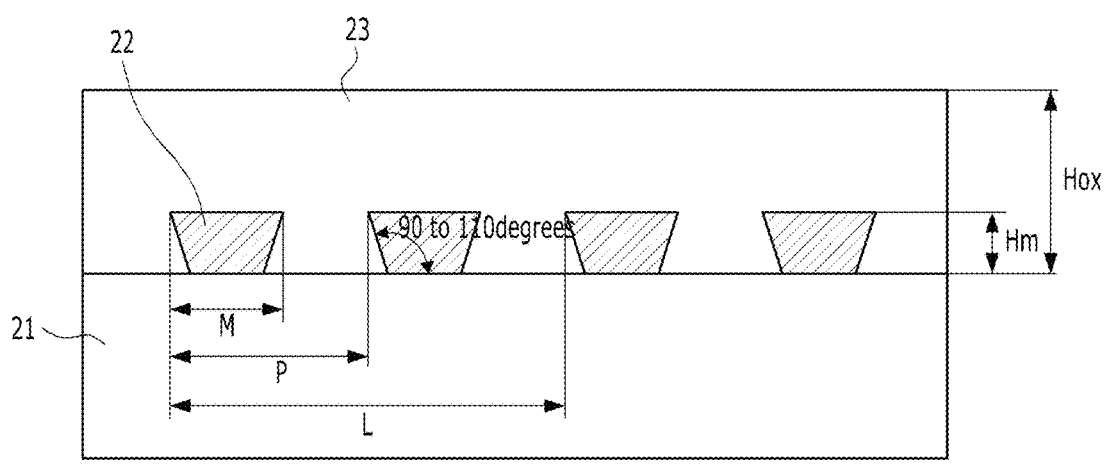
FIG. 2 is a cross-sectional view showing a temperature compensated surface acoustic wave resonator according to an embodiment of the present invention.

FIG. 2 is a cross-sectional view showing a temperature compensated surface acoustic wave resonator according to an embodiment of the present invention.

Referring to FIG. 2, a temperature compensated surface acoustic wave resonator 20 according to an embodiment of the present invention includes a piezoelectric substrate 21, a plurality of metal structures 22 formed on the top surface of the piezoelectric substrate 21 to have a negative profile, and a temperature compensation layer 23 covering the top surface of the piezoelectric substrate 21 and all the metal structures 22. The temperature compensation layer 23 covers the metal structures 22 and contacts with the piezoelectric substrate 21. A LN (LiNbO3) 128 degree substrate may be used as the piezoelectric substrate 21. In addition, the temperature compensation layer 23 may use SiO2, AlN, TeO2 or the like.

In the temperature compensated surface acoustic wave resonator 20 according to an embodiment of the present invention, since the width of the bottom surface of the metal structure contacting with the top surface of the piezoelectric substrate 21 is smaller than the width of the top surface opposite to the bottom surface of the metal structure, the side surface of the metal structure 22 has a negative profile of more than 90 degrees with respect to the surface where the top surface of the piezoelectric substrate 21 contacts with the bottom surface of the metal structure 22. In an embodiment of the present invention, the side surface of the metal structure 22 is formed between 90 and 110 degrees with respect to the surface where the top surface of the piezoelectric substrate 21 contacts with the bottom surface of the metal structure 22.

In addition, as shown in FIG. 2, in the temperature compensated surface acoustic wave resonator 20 according to an embodiment of the present invention, a ratio M/P of the metal line width M to the pitch P is 0.3 to 0.7 and is set to about 0.5 in the embodiment of FIG. 2. In addition, a ratio Hm/L of the layer thickness Hm of the metal structure 22 to the wavelength of surface acoustic waves generated by the surface acoustic wave resonator L ($\lambda$) is 4 to 10% and is set to about 7% in the embodiment of FIG. 2. In addition, a ratio Hox/L of the thickness Hox of the temperature compensation layer 23 to the wavelength L ($\lambda$) is 20 to 40% and is set to about 30% in the embodiment of FIG. 2.

The metal structure 22 uses Cu as a main material, and Cr, Ag, Ti, Al, Ni or the like may be contained in the bottom surface and the side surface of the Cu.

Figure 3:
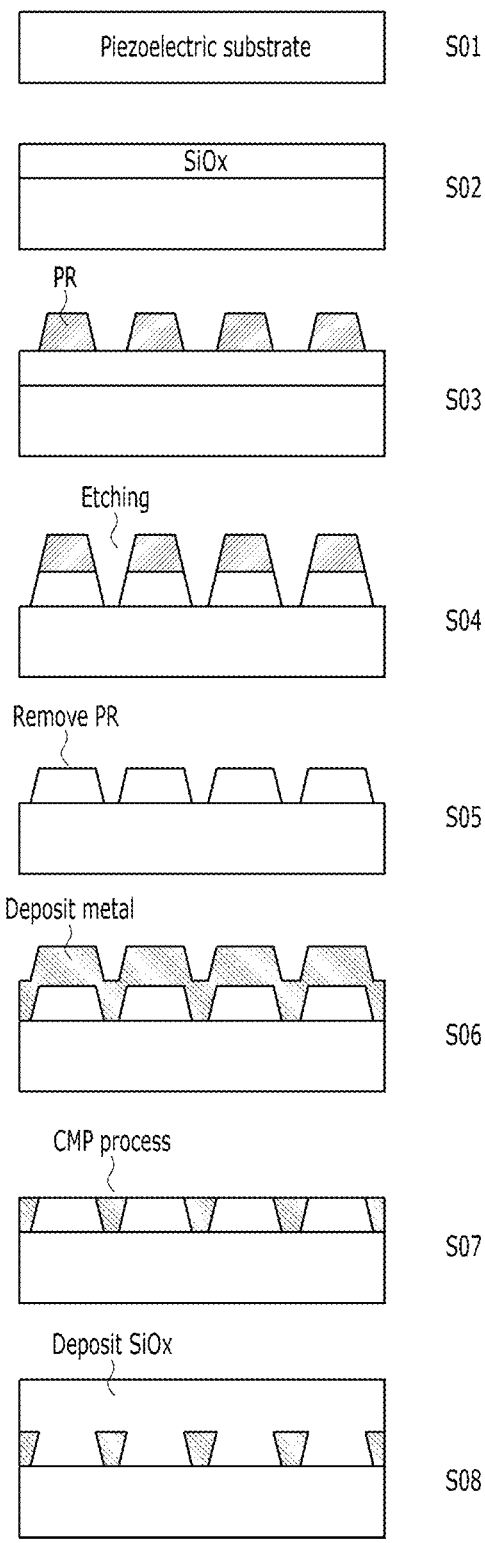
FIGS. 3 and 4 are views receptively showing a manufacturing process of a temperature compensated surface acoustic wave resonator according to an embodiment of the present invention.
Figure 4:
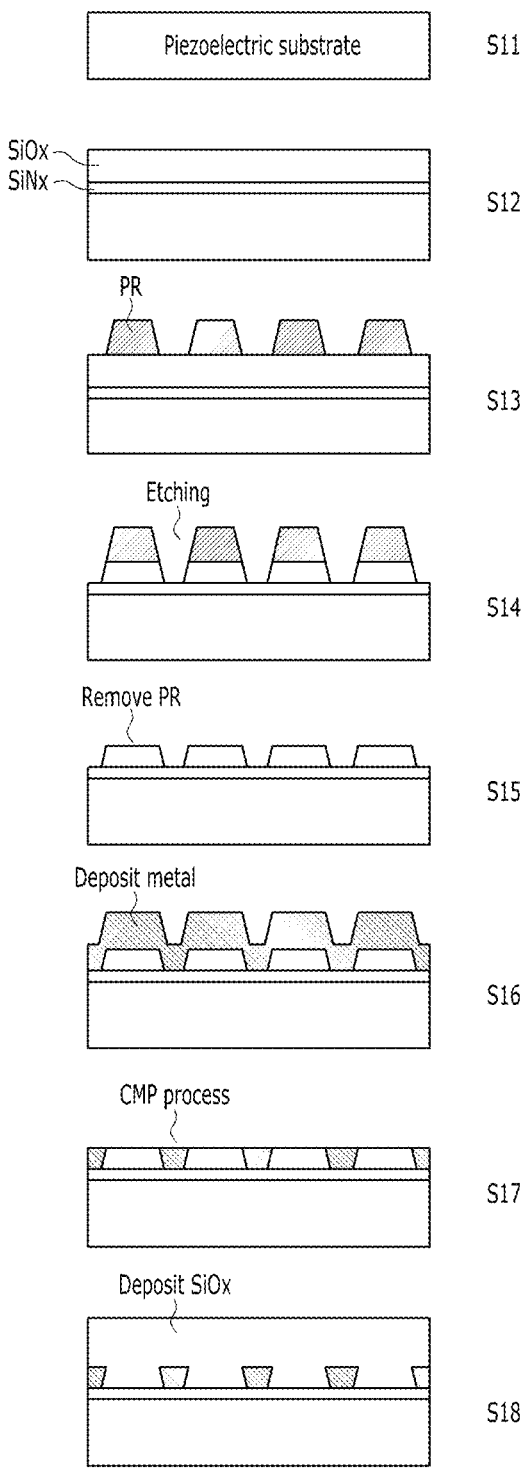

FIGS. 3 and 4 are views receptively showing a process of manufacturing a temperature compensated surface acoustic wave resonator according to an embodiment of the present invention.

Referring to FIGS. 3 and 4, a method of manufacturing a temperature compensated surface acoustic wave resonator includes the steps of preparing a piezoelectric substrate first (step S01 or S11) and depositing a temperature compensation layer on the piezoelectric substrate (step S02 or S12). The temperature compensation layer may be deposited through a chemical vapor deposition (CVD) or sputtering process. The temperature compensation layer may use $SiO_2$, AlN, $TeO_2$ or the like.

Although only SiOx is deposited at the step of depositing the temperature compensation layer of FIG. 3 (step S02), SiOx and SiNx are mixed and deposited at the step of depositing the temperature compensation layer of FIG. 4 (step S12), and as an embodiment, a SiNx layer is thinly deposited first, and then a SiOx layer is deposited thereon.

Then, a photo resistor is patterned on the deposited temperature compensation layer (step S03 or S13). Then, the temperature compensation layer formed in the open portion of the patterned photo resistor is removed by etching (step S04 or S14). At this point, the photo resistor pattern is formed such that the width of the open portion of the photo resistor decreases toward the piezoelectric substrate, and in the same manner, when the temperature compensation layer is removed by etching, the temperature compensation layer is removed to have a width decreasing toward the piezoelectric substrate.

Next, the photo resistor is removed (step S05 or S15). When the photo resistor is removed, the temperature compensation layer exists on the piezoelectric substrate in an etched form. Then, a metal structure layer is formed in a damascene process (step S06 or S16). Since the temperature compensation layer is etched to have a width decreasing toward the piezoelectric substrate when the photo resistor is patterned and the temperature compensation layer is etched, in the metal structure layer deposited at step S06 (or S16), the side surface of the metal structure has a negative profile of more than 90 degrees with respect to the surface where the top surface of the piezoelectric substrate contacts with the bottom surface of the metal structure. In the embodiments shown in FIGS. 3 and 4, the side surface of the metal structure is formed between 90 and 110 degrees with respect to the surface where the top surface of the piezoelectric substrate contacts with the bottom surface of the metal structure. In addition, in this step, the metal structure layer uses Cu as a main material, and Cr, Ag, Ti, Al, Ni or the like may be contained in the bottom surface and the side surface of the Cu, which is the main material of the metal structure, by forming a layer first using Cr, Ag, Ti, Al, Ni or the like before the Cu layer is formed and subsequently forming the Cu layer.

Next, the metal structure layer formed like this is removed until the temperature compensation layer is exposed by applying a Chemical Mechanical Polishing (CMP) process (step S07 or S17). Then, a temperature compensation layer (of SiOx or the like) is additionally deposited on the temperature compensation layer and the metal structures (step S08 or S18).

In the temperature compensated surface acoustic wave resonator manufactured in the process described above according to an embodiment of the present invention, as shown in FIG. 2, a ratio M/P of the metal line width M to the pitch P is 0.3 to 0.7 (preferably about 0.5), and in addition, a ratio Hm/L of the layer thickness Hm of the metal structure to the wavelength L (λ) is 4 to 10% (preferably about 7%), and a ratio Hox/L of the thickness Hox of the temperature compensation layer to the wavelength L (λ) is 20 to 40% (preferably about 30%). The pitch P, the line width M and the wavelength L of the surface acoustic wave resonator are determined at the step of patterning the photo resistor or at the step of etching the temperature compensation layer after patterning the photo resistor. In addition, the thickness Hm of the metal structure layer of the surface acoustic wave resonator is determined at the step of removing the metal structure layer (step S07 or S17), and the thickness Hox of the temperature compensation layer is determined at the step of forming the additional temperature compensation layer (step S08 or S18).

Figure 5:
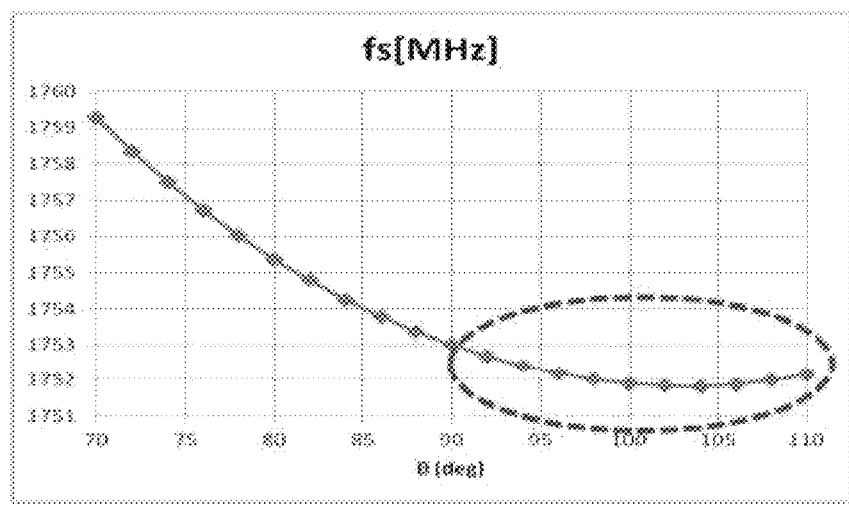
FIGS. 5 and 6 are views showing the frequency characteristic of a temperature compensated surface acoustic wave resonator with respect to the characteristic of a metal profile according to an embodiment of the present invention.
Figure 6:
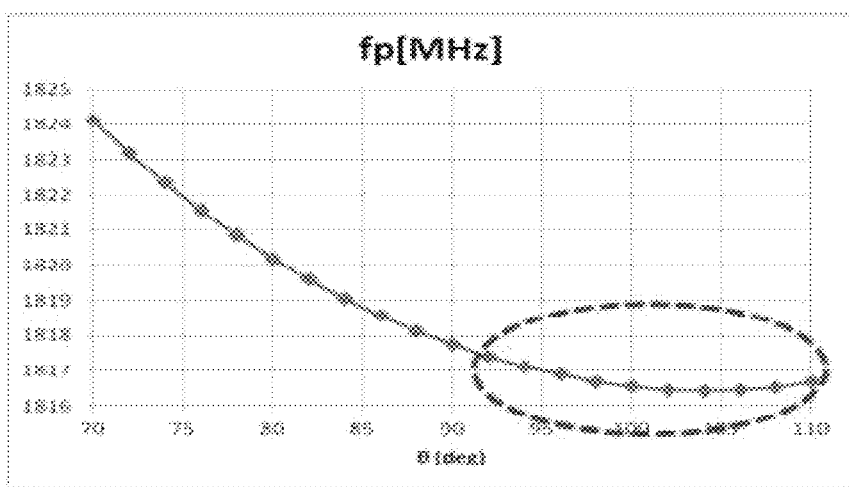

FIGS. 5 and 6 are views showing the frequency characteristic of a temperature compensated surface acoustic wave resonator with respect to the characteristic of a metal profile according to an embodiment of the present invention.

FIG. 5 shows change of resonance frequency fs with respect to the value of the cross-sectional angle of the metal structure, and FIG. 6 shows change of semi-resonance frequency fp with respect to the value of the cross-sectional angle of the metal structure.

As shown in FIGS. 5 and 6, it can be confirmed that when the cross-sectional angle of the metal structure has a positive profile lower than 90 degrees, the frequency is sensitive to the change of the angle of the metal structure since changes in the resonance frequency fs and the semi-resonance frequency fp are large, however, when the cross-sectional angle of the metal structure has a negative profile between 90 and 110 degrees, the frequency is considerably insensitive to the change of the angle of the metal structure since changes in the resonance frequency fs and the semi-resonance frequency fp are almost nothing.

Accordingly, a surface acoustic wave resonator having a negative profile according to an embodiment of the present invention has a frequency characteristic insensitive to change of profile.

Figure 7:
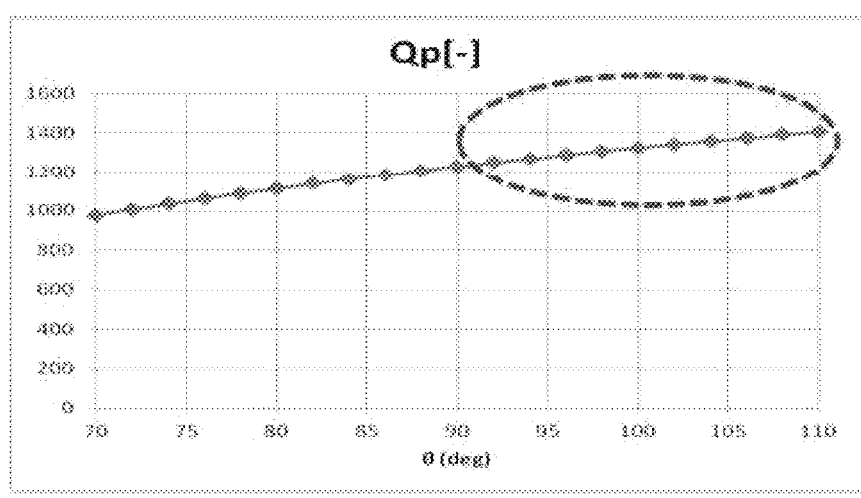
FIG. 7 is a view showing Q values of a temperature compensated surface acoustic wave resonator with respect to the characteristic of a metal profile according to an embodiment of the present invention.

FIG. 7 is a view showing Q values (Quality factors) of a temperature compensated surface acoustic wave resonator with respect to the characteristic of a metal profile according to an embodiment of the present invention.

Referring to FIG. 7, it can be confirmed that the SAW resonator has a larger Q value characteristic when the cross-sectional angle of the metal structure is between 90 and 110 degrees (negative profile), compared with a case when the cross-sectional angle of the metal structure has a positive profile lower than 90 degrees. Like this, it is effective in that the surface acoustic wave resonator having a negative profile according to an embodiment of the present invention has a high semi-resonance Q value characteristic.

Accordingly, the surface acoustic wave resonator having a negative profile according to an embodiment of the present invention has a frequency characteristic insensitive to change of profile.

In addition, the surface acoustic wave resonator having a negative profile according to an embodiment of the present invention has an effect of having a high semi-resonance Q value characteristic.

Those skilled in the art may understand that the present invention can be embodied in another specific form without changing the technical spirits or essential features. Therefore, it should be understood that the embodiments described above are illustrative and not restrictive in all aspects. Accordingly, it should be construed that the scope of the present invention includes the description of the claims and all the changes or modified forms derived from the equivalents thereof.

What is claimed is:
1. A surface acoustic wave resonator comprising:
   a piezoelectric substrate;

a plurality of metal structures formed on a top surface of the piezoelectric substrate to have a negative profile; and a temperature compensation layer covering the top surface of the piezoelectric substrate and the plurality of metal structures, wherein a width of a bottom surface of each of the plurality of metal structures contacting with the top surface of the piezoelectric substrate is smaller than a width of a top surface of each of the plurality of metal structures, and a side surface of each of the plurality of metal structures has a negative profile of more than 90 degrees with respect to a surface where the top surface of the piezoelectric substrate contacts with the bottom surface of each of the plurality of metal structures.

2. The surface acoustic wave resonator according to claim 1, wherein the piezoelectric substrate is a $LiNbO_3$ 128 degree substrate.

3. The surface acoustic wave resonator according to claim 1, wherein the side surface of each of the plurality of metal structures is formed between 90 and 110 degrees with respect to the surface where the top surface of the piezoelectric substrate contacts with the bottom surface of each of the plurality of metal structures.

4. The surface acoustic wave resonator according to claim 1, wherein each of the plurality of metal structures includes Cu.

5. The surface acoustic wave resonator according to claim 1, wherein the temperature compensation layer contains any one of materials of $SiO_2$, AlN and $TeO_2$.

6. The surface acoustic wave resonator according to claim 1, wherein in each of the plurality of metal structures, a ratio (M/P) of a metal line width (M) to a pitch (P) is 0.3 to 0.7, where the metal line width (M) is the width of the top surface of each of the plurality of metal structures, and the pitch (P) is a distance between an end point of the width of the top surface of one metal structure and a corresponding end point of the width of the top surface of another metal structure adjacent to the one metal structure.

7. The surface acoustic wave resonator according to claim 1, wherein a thickness of each of the plurality of metal structures is 4 to 10% of a wavelength λ of surface acoustic waves generated by the surface acoustic wave resonator.

8. The surface acoustic wave resonator according to claim 1, wherein a thickness of the temperature compensation layer is 20 to 40% of a wavelength λ of surface acoustic waves generated by the surface acoustic wave resonator.

9. A method of manufacturing a surface acoustic wave resonator, the method comprising the steps of:

depositing a temperature compensation layer on a piezoelectric substrate;

patterning a photo resistor on the temperature compensation layer;

removing the temperature compensation layer formed in an open portion of the patterned photo resistor by etching;

removing the photo resistor;

forming a metal structure layer having a negative profile;

removing the metal structure layer until the temperature compensation layer is exposed; and depositing an additional temperature compensation layer on the temperature compensation layer and the metal structure layer.

10. The method according to claim 9, wherein the step of depositing a temperature compensation layer on the piezoelectric substrate includes the step of depositing a mixture of silicon nitride and silicon oxide or depositing a silicon oxide layer after depositing a silicon nitride layer.

11. The method according to claim 9, wherein a thickness of the temperature compensation layer is 20 to 40% of a wavelength λ of surface acoustic waves generated by the surface acoustic wave resonator.

12. The method according to claim 9, wherein in the step of removing the temperature compensation layer by etching, the temperature compensation layer formed in the open portion of the patterned photo resistor is removed in such a manner that a width of the temperature compensation layer formed in the open portion of the patterned photo resistor decreases toward the piezoelectric substrate, so that in the step of forming the metal structure layer, a side surface of the metal structure layer is formed to have a negative profile of more than 90 degrees with respect to a surface where a top surface of the piezoelectric substrate contacts with a bottom surface of the metal structure layer.

13. The method according to claim 12, wherein the side surface of the metal structure layer is formed between 90 and 110 degrees with respect to the surface where the top surface of the piezoelectric substrate contacts with the bottom surface of the metal structure layer.

14. The method according to claim 9, wherein the step of forming a metal structure layer includes the step of forming the layer using a material including Cu.

15. The method according to claim 9, wherein a thickness of the metal structure layer is 4 to 10% of a wavelength λ of surface acoustic waves generated by the surface acoustic wave resonator.

16. The method according to claim 9, wherein in the metal structure layer which is formed of a plurality of metal structures after the step of removing the metal structure layer until the temperature compensation layer is exposed, a ratio (M/P) of a metal line width (M) to a pitch (P) is 0.3 to 0.7, where the metal line width (M) is a width of a top surface of each of the plurality of metal structures, and the pitch (P) is a distance between an end point of the width of the top surface of one metal structure and a corresponding end point of the width of the top surface of another metal structure adjacent to the one metal structure.

* * * * *